United States Patent [19]

Heidelberg

[11] 3,881,914

[45] May 6, 1975

[54] PREPARATION OF ELECTRONIC GRADE COPPER

[75] Inventor: Eric X. Heidelberg, Toledo, Ohio

[73] Assignee: Owens-Illinois, Inc., Toledo, Ohio

[22] Filed: Apr. 26, 1974

[21] Appl. No.: 464,356

[52] U.S. Cl. .................................... 75/.5 A; 75/117

[51] Int. Cl. .......................... C22b 15/12; B22f 9/00

[58] Field of Search .............................. 75/.5 A, 117

[56] References Cited

UNITED STATES PATENTS

| | | | |
|---|---|---|---|
| 1,257,943 | 2/1918 | Howard | 75/.5 A |
| 2,810,759 | 10/1957 | Cottle et al. | 75/.5 A |
| 3,703,451 | 11/1972 | Healey et al. | 75/117 |

*Primary Examiner*—W. Stallard
*Attorney, Agent, or Firm*—Robert F. Rywalski; Edward J. Holler

[57] ABSTRACT

Electronic grade, elemental copper suitable for use in forming thick film conductive circuits is reproducibly provided by a process which involves reacting copper sulfate or copper acetate with hypophosphorous acid in water, separating the formed elemental copper, washing the separated copper with a water miscible, inert organic solvent, and then vacuum drying the material with the vacuum upon completion of the drying, being released by the introduction of an inert gas.

17 Claims, No Drawings

PREPARATION OF ELECTRONIC GRADE COPPER

The present invention is directed to the formation of elemental copper and, more particularly, is directed to a process for reproducibly forming high quality copper powder suitable for use as electronic grade copper in the microelectronics industry.

It is well known in the microelectronic industry that copper, along with a suitable binder, typically a low melting glass and a suitable carrier, can be applied onto a ceramic substrate in order to ultimately produce a thick film conductive circuit. Typical of the substrates which are employed are alumina, fused silica, berillia, glass and the like. These thick film conductive circuits can be manufactured by directly printing, for example by silk screen techniques, a desired circuit pattern on the substrate or, alternatively, the desired circuit can be formed by what is referred to in the art as an "etch-back" technique. In the latter technique a mixture of copper and a suitable binder, typically a low melting glass, and an appropriate vehicle are applied onto the substrate followed by appropriate heating to produce a glaze in which the copper is uniformly and conductively dispersed in the carrier. By use of conventional photo-resist techniques, a desired circuit pattern is formed after etching away the appropriate areas.

In order for a high quality thick film conductive circuit to be produced from either of the foregoing techniques the copper powder employed must possess a balance of many properties, some of which include a small particle size, high surface area, high purity, proper geometry, proper adhesion to the binder, good conductivity, etc. If all of these properties are not present poor quality circuits will result; they may possess an undesirable orange peel configuration or fish eye formation may result. Along the same lines, difficulty can be encountered in the formation of the required precise printed circuit with thickness etc., when done by silk screen techniques because of the possibility of screen clogging. Additionally, in subsequent processing, if the proper properties are not present in the copper, severe difficulties can be encountered with solderability.

From the foregoing, it will be appreciated that the requirements of electronic grade copper, suitable for use in forming thick film conductive circuit patterns in the microelectronics industry, are quite demanding and, accordingly, receive a premium price on the market. Thus, in accordance with this invention, there is provided an economical process for reproducibly and safely forming elemental copper, in yields of an excess of 90 percent and more typically in excess of 98 percent, for use in the microelectronics industry.

In accordance with one feature of this invention, there is provided a process for producing electronic grade copper comprising: combining, with water, copper sulfate or copper acetate and at least about 2 moles of hypophosphorous acid per mole of copper sulfate or copper acetate; allowing said combination to react at a time and for a temperature sufficient to obtain elemental copper; separating said elemental copper, for example, by filtration; washing said elemental copper with a water miscible, inert organic solvent; vacuum drying said washed copper and upon completion of the drying releasing the vacuum by introducing an inert gas into the drier.

In accordance with a further feature of this invention, there is provided a process for reliably producing small particle size, pure elemental copper suitable for use in manufacturing thick film conductive circuits which comprises: reacting a system consisting essentially of copper sulfate or copper acetate, hypophosphorous acid and water so as to form elemental copper, the amount of hypophosphorous acid being at least about 2 moles per mole of sulfate or acetate; separating said elemental copper from said reacted system; washing said separated copper with a water miscible inert organic solvent; vacuum drying said washed copper and introducing upon completion of said vacuum drying an inert gas into the drier to release the vacuum.

As indicated above, the first step in the process involves the reaction of copper acetate or copper sulfate and hypophosphorous acid in water to form elemental copper. The amount of hypophosphorous acid which will be employed will be at least about 2 moles per mole of copper sulfate, or copper acetate. When using less than that amount there has been a notable tendency of the elemental copper to be severely contaminated with large flakes and/or chunks which, obviously, is quite undesirable. Excellent results will be obtained using between about 2 to about 3 moles of hypophosphorous acid per mole of copper sulfate or copper acetate, with the preferred amount being about 2 moles per mole. Any suitable and convenient time and temperature may be employed for the reaction but it is usually preferred to react the materials by heating at a temperature between about 80°C to a temperature of about 99°C and preferably to about 80° to about 85°C. Any pressure may be employed but the reaction proceeds quite well at ambient pressure. The completion of the reaction may be monitored by the subsiding of foaming which results during the reaction because of effervescence. Heating times will, of course, vary with the size of the batch being employed but generally about 10–15 minutes is quite convenient. The amount of water employed may be varied with excellent results being obtained, in terms of product quality and reaction control, by employing about 50 to about 60 moles of water per mole of copper sulfate or copper acetate.

After the formation of the elemental copper by the reaction, the copper appears as a solid and it is separated in any convenient manner from the reaction medium. Filtration is generally preferred and will be found to be quite convenient. The resulting separated elemental copper is then washed with a water miscible, inert organic solvent so as to displace the water from e.g. the filter cake. The solvent will be routinely selected by those skilled in the art. It is generally preferred to employ a water miscible inert organic solvent which is at least as volatile as water. Exemplarly solvents include the lower alkyl alcohols for example the $C_1$ to $C_3$ alkyl alcohols as well as other solvents such as, for example, lower boiling glycols or cellosolves. The preferred solvents are methanol or ethanol. Subsequent to the washing, the copper is vacuum dried in any conventional vacuum drier. The time, temperature, and degree of vacuum does not appear to be critical and will be routinely selected by those skilled in the art. Conveniently the vacuum drying will be done under a vacuum of about 20 to about 100 millimeters of mercury, preferably about 20 to about 40 millimeters of mercury with suitable temperatures being about 50°C to about 100°C. Additionally, when the vacuum is released on the vacuum drier employed this release will be effected by introducing an inert gas such as helium, neon, argon, or the like into the vacuum drier. Argon is preferred. The reason for the washing with the water miscible organic solvent and the vacuum release with an inert glass is to reproducibly insure the formation of the high quality product and that this is done in a safe manner. Without employing these procedures, ignition of the copper powder has resulted upon release of the vacuum, which ignition not only, obviously, is a safety hazard but which also significantly and detrimentally affects the quality of the product.

Generally, the copper powders produced in accordance with this invention have surface areas on the order of 1–2 sq. meters/gram, as measured by conventional absorption techniques, and have particle sizes less than about 1 or 2 microns. When employed in the manner indicated above for forming thick film conductive circuits they produce an excellent high quality product.

While the above is believed to fully describe the present invention and enables those skilled in the art to make and use same, and sets forth the best mode contemplated in practicing this invention, a representative example follows.

EXAMPLE I

Into a reactor there was charged approximately 1,000 ml of distilled water followed by the addition of 1 gram-mole of cupric sulfate. Two moles of hypophosphorous acid was then added and with stirring the system was heated between about 80° to about 85°C and held at that temperature for about 15 minutes. The copper was then separated, by filtration, washed with distilled water and then further washed with methanol. The amount of methanol, employed for the washing, was about twice the volume of filter cake. The washed copper was then dried in a conventional vacuum drier at about 70°–100°C and at a pressure of about 20 millimeters of mercury for about 16 hours. After cooling to about 30°C the vacuum was released by introducing argon into the drier. Copper in nearly a stoichiometric yield based on the copper sulfate was obtained and demonstrated excellent qualities for use in the formation of thick film conductive circuits.

I claim:

1. A process for producing electronic grade copper comprising: combining copper sulfate or copper acetate with water and at least about 2 moles of hypophosphorous acid per mole of copper sulfate or copper acetate; allowing said combination to react at a time and for a temperature sufficient to obtain elemental copper; separating said elemental copper; washing said separated elemental copper with a water miscible, inert organic solvent; vacuum drying said washed copper and upon completion of the drying releasing the vacuum by introducing an inert gas into the drier.

2. The process of claim 1 wherein about 2 to about 3 moles of hypophosphorous acid is employed per mole of copper sulfate or copper acetate.

3. The process of claim 2 wherein copper sulfate is employed.

4. The process of claim 2 wherein copper acetate is employed.

5. The process of claim 3 wherein the mole ratio of hypophorphorous to copper acetate or copper sulfate is about 2:1.

6. The process of claim 1 wherein said combination is allowed to react at a temperature of between about 80°C and about 99°C.

7. The process of claim 2 wherein said water miscible organic solvent is methanol.

8. The process of claim 1 wherein said water miscible organic solvent is ethanol.

9. The process of claim 1 wherein said inert gas is argon.

10. The process of claim 9 wherein said vacuum drying is done at a pressure of about 20 to about 100 millimeters of mercury.

11. The process of claim 10 wherein the amount of water is between about 50 to about 60 moles of water per mole of copper sulfate or copper acetate.

12. The process for producing small particle size, pure, elemental copper suitable for use in manufacturing thick film conductive circuits which comprises: reacting a system consisting essentially of copper sulfate or copper acetate, hypophosphorous acid and water so as to form elemental copper, the amount of hypophosphorous acid being at least about 2 moles per mole of sulfate or acetate; separating said elemental copper from said reacted system; washing said separated copper with a water miscible inert organic solvent; vacuum drying said washed copper and introducing, upon completion of said vacuum drying, an inert gas into said drier to release the vacuum.

13. The process of claim 12 wherein said system is reacted between about 80°C and 99°C for at least about 10 minutes.

14. The process of claim 12 wherein said copper is separated by filtration.

15. The process of claim 14 wherein said organic solvent is methanol.

16. The process of claim 14 wherein said solvent is ethanol.

17. The process of claim 12 wherein said inert gas is argon.

* * * * *